(12) United States Patent
Kropp

(10) Patent No.: US 7,359,646 B2
(45) Date of Patent: Apr. 15, 2008

(54) TRANSMITTER AND/OR RECEIVER ARRANGEMENT OF OPTICAL SIGNAL TRANSMISSION

(75) Inventor: Jorg-Reinhardt Kropp, Berlin (DE)

(73) Assignee: Finisar Corporation, Sunnyvale, CA (US)

( * ) Notice: Subject to any disclaimer, the term of this patent is extended or adjusted under 35 U.S.C. 154(b) by 503 days.

(21) Appl. No.: 10/489,683

(22) PCT Filed: Sep. 14, 2001

(86) PCT No.: PCT/DE01/03603

§ 371 (c)(1),
(2), (4) Date: Sep. 22, 2004

(87) PCT Pub. No.: WO03/027743

PCT Pub. Date: Apr. 3, 2003

(65) Prior Publication Data

US 2005/0036732 A1    Feb. 17, 2005

(51) Int. Cl.
*H04B 10/00* (2006.01)
*H04B 10/12* (2006.01)

(52) U.S. Cl. .................. 398/164; 398/139; 398/141

(58) Field of Classification Search ............. 398/164, 398/130, 141, 138, 139, 182, 200, 201
See application file for complete search history.

(56) References Cited

U.S. PATENT DOCUMENTS

| | | | |
|---|---|---|---|
| 4,625,333 A * | 11/1986 | Takezawa et al. | 398/139 |
| 4,636,647 A | 1/1987 | Nishizawa | |
| 5,093,879 A * | 3/1992 | Bregman et al. | 385/93 |
| 5,105,237 A | 4/1992 | Hasegawa et al. | |
| 5,610,395 A | 3/1997 | Nishiyama | |
| 5,981,945 A | 11/1999 | Spaeth et al. | |
| 6,019,523 A | 2/2000 | Honmou | |
| 6,567,435 B1 | 5/2003 | Scott et al. | |
| 6,873,799 B2 * | 3/2005 | Cohen et al. | 398/135 |
| 2001/0004413 A1 | 6/2001 | Aihara | |

FOREIGN PATENT DOCUMENTS

| | | |
|---|---|---|
| DE | 195 08 222 C1 | 6/1996 |
| DE | 298 13 985 U1 | 10/1998 |
| EP | 0 127 401 A1 | 12/1984 |
| EP | 0 466 975 A1 | 1/1992 |
| EP | 0 684 651 A2 | 11/1995 |
| EP | 0 889 533 A2 | 1/1999 |
| EP | 1 109 041 A1 | 6/2001 |
| WO | WO 00/57522 * | 9/2000 |
| WO | WO 00/57522 A1 | 9/2000 |
| WO | WO 01/57572 A2 * | 8/2001 |

* cited by examiner

*Primary Examiner*—M. R. Sedighian
(74) *Attorney, Agent, or Firm*—Workman Nydegger

(57) ABSTRACT

An optical transmitting and/or receiving arrangement including an optical element mounted in an intermediate space between a base plate and a lens. The lens is supported by a structure that is mounted on the base plate, and a carrier element mounted on the base plate and has an end portion extending through an opening formed in the structure and into the intermediate space. The end portion of the carrier element is positioned adjacent to the optical element, and includes electrical feed lines that are connected to the optical element by wires or bands. A transparent casting compound is then injected through the opening into the intermediate space.

17 Claims, 6 Drawing Sheets

TRANSMITTER AND/OR RECEIVER ARRANGEMENT OF OPTICAL SIGNAL TRANSMISSION

FIELD OF THE INVENTION

The invention relates to a transmitting and/or receiving arrangement for optical signal transmission.

BACKGROUND OF THE INVENTION

In optical communications transmission, transmitting and/or receiving arrangements are used to couple light signals into a waveguide and/or to detect optical signals received by a waveguide. For data communication applications, compact and low-cost transmitting and/or receiving arrangements are required both for multi-mode optical waveguides and for single-mode optical waveguides.

There are known, for example from EP 0 684 651 A2, transmitting and/or receiving arrangements in which a transmitting and/or receiving element is arranged in a hermetically sealed manner in what is known as a TO package. TO packages are standard packages known in the prior art for optical transmitting or receiving elements, the form of which resembles the case of a (classic) transistor, which however have on the upper side a glass window for light to enter and leave. Signals are fed in via contact pins, which are led away downward from the TO package. Transmitting and/or receiving arrangements for optical signal transmission with TO packages have the disadvantage that they are only suitable to a limited extent for high-frequency applications. Use in the frequency range of several Gbit/s and more is only possible with special individual adaptation of the electronics.

Furthermore, in the prior art there are known transmitting and/or receiving arrangements in which special, hermetically sealed high-frequency packages which allow lateral leading-through of the optical waveguide or optical beam are provided. Such high-frequency packages with lateral lead-through are very complex and expensive.

SUMMARY OF THE INVENTION

Starting out from this prior art, the present invention is directed to a transmitting and/or receiving arrangement for optical signal transmission which, while of a simple and low-cost construction, can be used even at high data rates above 1 Gbit/s.

It is thus provided according to the invention that the electrical feeds are arranged on a carrier element, which is fastened on the base plate and extends at least partly into the intermediate space between the base plate and the beam-shaping element, the carrier element with the electrical line feeds being brought right up close to the optical transmitting and/or receiving element and thereby partly filling a lateral opening which the intermediate space has.

This constitutes a non-hermetic packaging combined with a special arrangement of the necessary components of a transmitting and/or receiving arrangement. Non-hermetic is understood in this case as meaning that there is no encapsulation of the transmitting and/or receiving arrangement brought about by soldering, welding, vitrified enclosure, etc.

The non-hermetic construction or the provision of at least one opening of the intermediate space between the base plate and the beam-shaping element allows the carrier element with the electrical line feeds to be brought right up close to the optical transmitting and/or receiving element. When this happens, the carrier element partly fills the lateral opening. The presence of a lateral opening of the intermediate space between the base plate and the beam-shaping element also creates the possibility of introducing a casting material into the intermediate space after the individual components have been arranged on the base plate.

This creates a special arrangement of the necessary components of a transmitting and/or receiving arrangement. In this case, the one surface of the base plate serves as a mounting area for the further components. This allows a more simple, lower-cost construction. The forming of an intermediate space makes it possible for components to be arranged in a protected manner on the base plate close to the transmitting and/or receiving arrangement.

In a preferred refinement of the invention, it is envisaged to introduce into the intermediate space between the base plate and the beam-shaping element, at least partly, a transparent casting compound, which completely fills the optical beam path between the transmitting and/or receiving element and the beam-shaping element. The transmitting and/or receiving element and associated contact lines are advantageously also completely enclosed by the casting compound in order to protect them. It is preferred in this respect for a soft casting compound, for instance a silicone compound, to be used as the casting material, in order that no forces are exerted by the casting compound on the transmitting and/or receiving element. The casting compound serves for protecting the transmitting and/or receiving element and the beam path from external influences such as dirt and moisture.

In a preferred refinement of the invention, the base plate has mechanical structures for the mechanical and/or optical alignment of the elements arranged on it. The mechanical structures are, for example, drilled holes in the base plate, elevations, or a specially shaped outer contour of the base plate or parts of the base plate.

The mechanical structures of the base plate allow an exact alignment of the transmitting and/or receiving element on the base plate. This may take place by means of optical image-recognition processes, the mechanical contours serving as markings for the image recognition. It is preferred for at least two such contours or markings to be provided. Instead of the use of image-recognition processes for the exact positioning and adjustment of the transmitting and/or receiving element 2, it may alternatively be provided that corresponding mechanical structures are formed on the transmitting and/or receiving element, so that a passive adjustment takes place between the transmitting and/or receiving element and the base plate by means of the corresponding structures.

Furthermore, the mechanical structures of the base plate serve for an alignment and fastening of the beam-shaping element. For instance, it is preferred for the beam-shaping element to have on the side facing the base plate mechanical structures which serve for the optical and/or mechanical alignment of the beam-shaping element during placement on the base plate. For example, the beam-shaping element has projections which engage in corresponding drilled holes of the base plate, whereby the beam-shaping element is at the same time fastened on the base plate and adjusted. Additional fastening by means of adhesive etc. is of course possible and may be appropriate.

It is preferred for the beam-shaping element connected to the base plate to have on the side facing the base plate a recess which forms the intermediate space between the base plate and the beam-shaping element. The beam-shaping element in this case represents a type of protective encapsulation of the transmitting and/or receiving element.

Apart from a lateral opening of the intermediate space, it is preferred for there to be at least one further opening, which is formed for example by a drilled hole in the base plate or in the beam-shaping element. Such a further opening represents a venting opening when the casting compound is filled into the intermediate space and facilitates the filling of the intermediate space with casting compound.

It is pointed out that it is preferred for the lateral opening not to be closed, since it serves to compensate for temperature-related variations in expansion of the transparent casting material.

In a preferred development of the invention, the carrier element with the electrical line feeds is a ceramic, in particular a small ceramic plate of nonconducting material, on the upper side of which the line feeds are formed. It is preferred in this respect for the line feeds to be formed in a way allowing them to operate at high frequency, for instance as striplines. Corresponding ceramic parts can be produced with high precision and low variations in their HF properties. Use of a ceramic as a carrier of the electrical line feeds therefore allows conductor tracks with precisely defined, constant and reproducible high-frequency properties to be provided.

In a development of the invention, the beam-shaping element has on its side facing away from the base plate contours for the coupling on of an optical waveguide. Alternatively, contours of this type are not formed on the beam-shaping element but on a separate coupling element which is connected to the base plate as a separate part. The coupling element in this case likewise has a lateral opening, so as not to close the intermediate space between the base plate and the beam-shaping element. Numerous ways of forming and connecting the beam-shaping element and the additional coupling element are conceivable here. For example, instead of being fastened to the base plate, the beam-shaping element may be fastened to the additional coupling element, the latter then of course being connected to the base plate.

It is within the scope of the invention to arrange further electronic and optoelectronic components in the intermediate space between the base plate and the beam-shaping element. For example, a monitor diode may be arranged under or alongside the transmitting and/or receiving element. If a monitor diode is located alongside the transmitting and/or receiving element, it is envisaged in a special refinement of the invention to form the interface between the beam-shaping element and the intermediate space in a slanting manner, at least in one region, so that part of the radiation emitted by the transmitting element is reflected back at the slanting interface and is consequently directed onto the monitor diode arranged alongside the transmitting element.

The slanting also prevents radiation emitted by the transmitting element from being returned to the transmitting element.

To increase the reflected radiation, it may be envisaged to apply a partly transparent or partly reflective film to the slanting region of the interface.

It is preferred for the base plate to be a leadframe or part of a leadframe, which is accompanied by the advantage of simple and low-cost production using standard methods. The individual components of the transmitting and/or receiving arrangement are fastened and aligned on the leadframe in the way described. Alternatively, the base plate comprises a planar substrate, for example a silicon substrate.

BRIEF DESCRIPTION OF THE DRAWINGS

The invention is explained in more detail below on the basis of several exemplary embodiments with reference to the figures of the drawing, in which.

DESCRIPTION OF PREFERRED EXEMPLARY EMBODIMENTS

Figure 1:
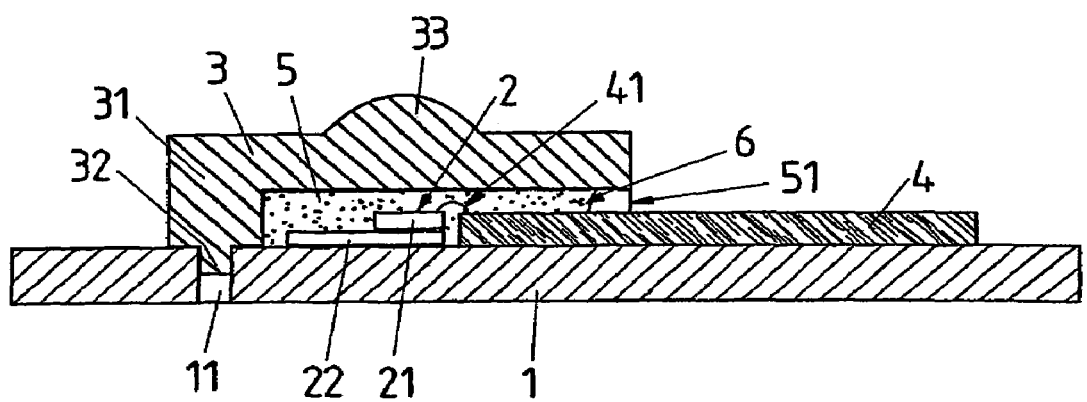
FIG. 1 schematically shows a first exemplary embodiment of a transmitting and/or receiving arrangement in a sectional view.

According to FIG. 1, the transmitting and/or receiving device comprises a base plate 1, an optical chip 2 as the transmitting and/or receiving element, a beam-shaping element 3 and a carrier element 4 for electrical line feeds.

It is preferred for the base plate 1 to be a leadframe or part of a leadframe, the surface of which serves as a mounting area for the further components. The optical chip 2 is arranged directly on the base plate 1 or the leadframe. In the exemplary embodiment represented, it comprises an optical transmitting element 21, for example a laser diode or a light-emitting diode, and an optical receiving element 22, for example a photodiode, which are arranged one above the other by a chip-on-chip mounting technique. Alternatively, only one transmitting element 21 or only one receiving element 22 is provided.

It is also pointed out that the transmitting element 21 does not have to be arranged above the receiving element 22. For instance, the transmitting element and the receiving element may similarly be arranged alongside each other on the base plate 1.

The electrical contacting of the optical chip 2 takes place by means of line feeds arranged on the carrier element 4. In this case, the carrier 4, which is likewise fastened directly on the base plate 1, is brought right up close to the optical chip 2. As indicated, an electrical connection takes place between the line feeds of the carrier element 4 and the optical chip by means of wires or small bands 41. The line guides of the carrier element are in turn contacted by means of the base plate (not represented) or a further electrical component.

It is preferred for the carrier element 4 to be a small ceramic plate, on which line feeds are formed in a way allowing them to operate at high frequency. For example, the line feeds are striplines. The carrier element 4 consisting of ceramic, with the line feeds arranged on the upper side, provides high-frequency properties even at high frequencies, of a kind which could not be created on the base part 1 itself, at any event not in the case in which it is formed as a leadframe.

The edge areas of the optical chip 2 and of the carrier element 4 with the line feeds may also be of the same height, as represented. With the contact areas of the chip 2 and carrier element 4 then at the same height, it is possible to use particularly short bonding wires or bands, thereby improving the high-frequency properties.

The beam-shaping element 3 is connected to the base plate 1 by means of at least one vertically running wall 31. For this purpose, the base plate has a drilled hole 11, into which a projection 32 of the beam-shaping element 3 engages. It is preferred for a plurality of such projections 32 to be provided on the periphery of the beam-shaping element and to engage in corresponding drilled holes 11 of the base plate. It is preferred for the wall 31 to be formed in such a way that it runs all around with the exception of an opening still to be explained, so that the beam-shaping element 3 forms a recess. This recess represents an intermediate space 5 between the base plate 1 and the beam-shaping element 3. The intermediate space has a lateral opening 51, so that the transmitting and/or receiving arrangement is not a hermetically sealed arrangement. The opening 51 of the intermediate space 5 makes it possible on the one hand for the carrier element 4 to be introduced into the intermediate space 5 right up close to the optical chip 2. Furthermore, the opening 51 of the intermediate space 5 makes it possible to fill the intermediate space 5 with a transparent casting compound 6 and thereby encapsulate in particular the optical chip 2 with the casting compound 6. It is preferred for the casting compound to be a soft casting compound, for example of silicone. The casting compound is of a relatively soft form in order that it does not exert any undesired forces on the optical chip 2. It protects the optical chip 2 from external influences and ensures that it no dirt particles, moisture or the like get into the beam path between the optical chip and the beam-shaping element.

It is advisable for the opening 51 of the intermediate space 5 between the base plate 1 and the beam-shaping element 3 to remain open even after positioning of the carrier element 4 and introduction of the casting compound 5, and not for instance to be closed, in order to provide compensation for changes in volume of the casting compound when there are changes in temperature, occurring on account of the coefficient of expansion changing with the temperature.

The beam-shaping element 3 forms above the optical chip 2 a lens 33, which focuses light emitted by the optical chip 2 onto the end face of an optical waveguide or focuses light emerging from the end face of an optical waveguide onto the optical chip, as will be explained further on the basis of the figures below.

It is pointed out that the drilled hole 11 represents a mechanical structure which, apart from the fastening of the beam-shaping element 3, also serves for the optical alignment of the further elements, in particular the optical chip 2. In this respect it is preferred for a multiplicity of drilled holes 11 to be provided, representing defined markings which are recognized by an image-recognition system for the placement of the optical chip 2 on the base plate, compared with an internal system of coordinates and evaluated to the effect that the optical chip 2 is arranged exactly in the desired position on the base plate 1. Instead of drilled holes 11, projections or elevations on the base plate may also be used as markings. The outer form of the base plate may also represent a marking which serves for the mechanical and/or optical alignment of the elements of the transmitting and/or receiving device.

It is further pointed out that, instead of by means of optical image recognition using the explained markings 11, the adjustment of the optical chip 2 on the base plate 1 may also be performed by structures being formed on the optical chip, which structures correspond to corresponding structures on the base plate and accordingly make possible a passive alignment or adjustment of the optical chip 2 on the base plate 1. In both cases, no active adjustment of the optical chip 2 is required.

Figure 2:
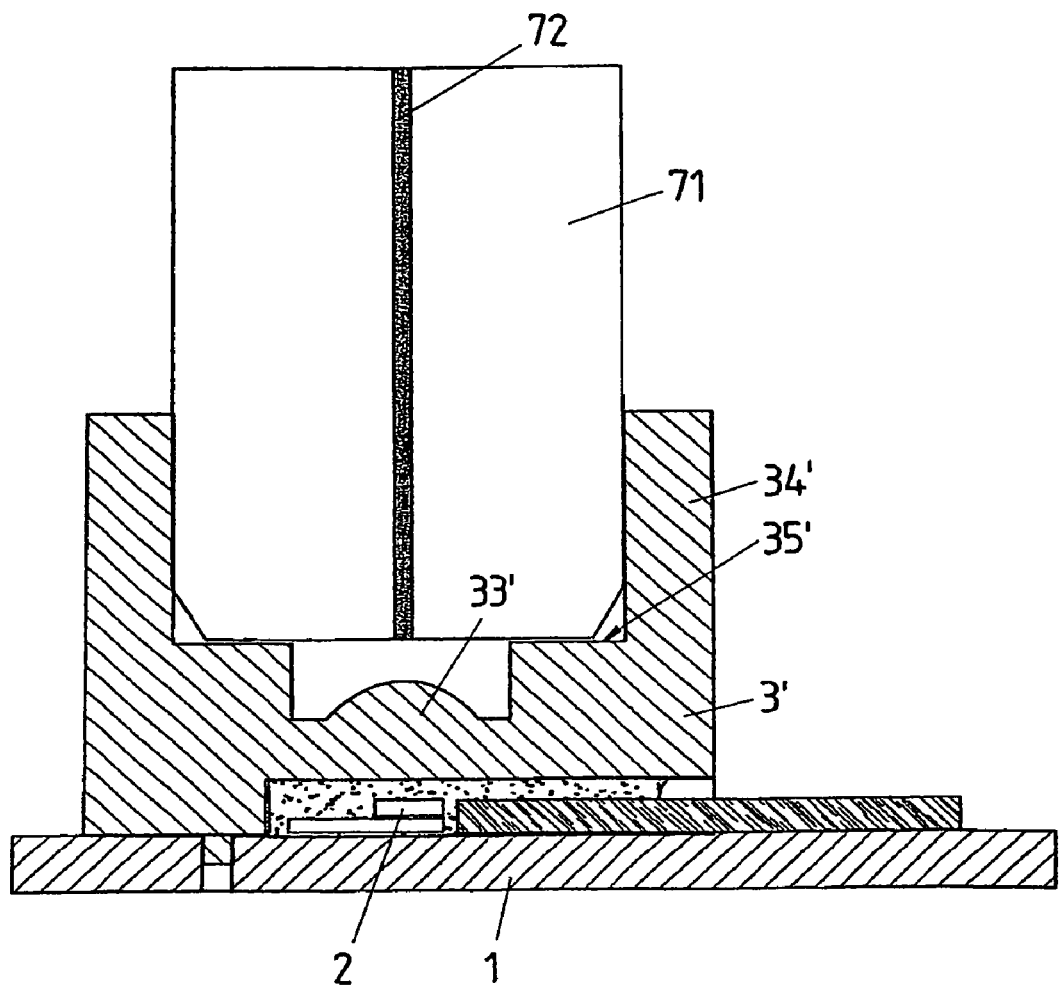
FIG. 2 schematically shows a second exemplary embodiment of a transmitting and/or receiving arrangement, in which the beam-shaping element forms contours for receiving an optical waveguide.

FIG. 2 shows an alternative exemplary embodiment of the invention in which the beam-shaping element 3' additionally forms, on the side facing away from the base plate 1, contours 34' by means of which a guide element 71 for an optical waveguide 72 can be coupled onto the transmitting and receiving arrangement. The guide element 71 is, for example, a ferrule which contains the optical waveguide 72 in a central bore. In the exemplary embodiment represented, the contours 34' are a cylindrical rim with an inner shoulder 35', which receive the guide element 71. A coupling between the optical waveguide 72 and the optical chip 2 takes place by means of the lens 33' of the beam-shaping element.

Figure 3:
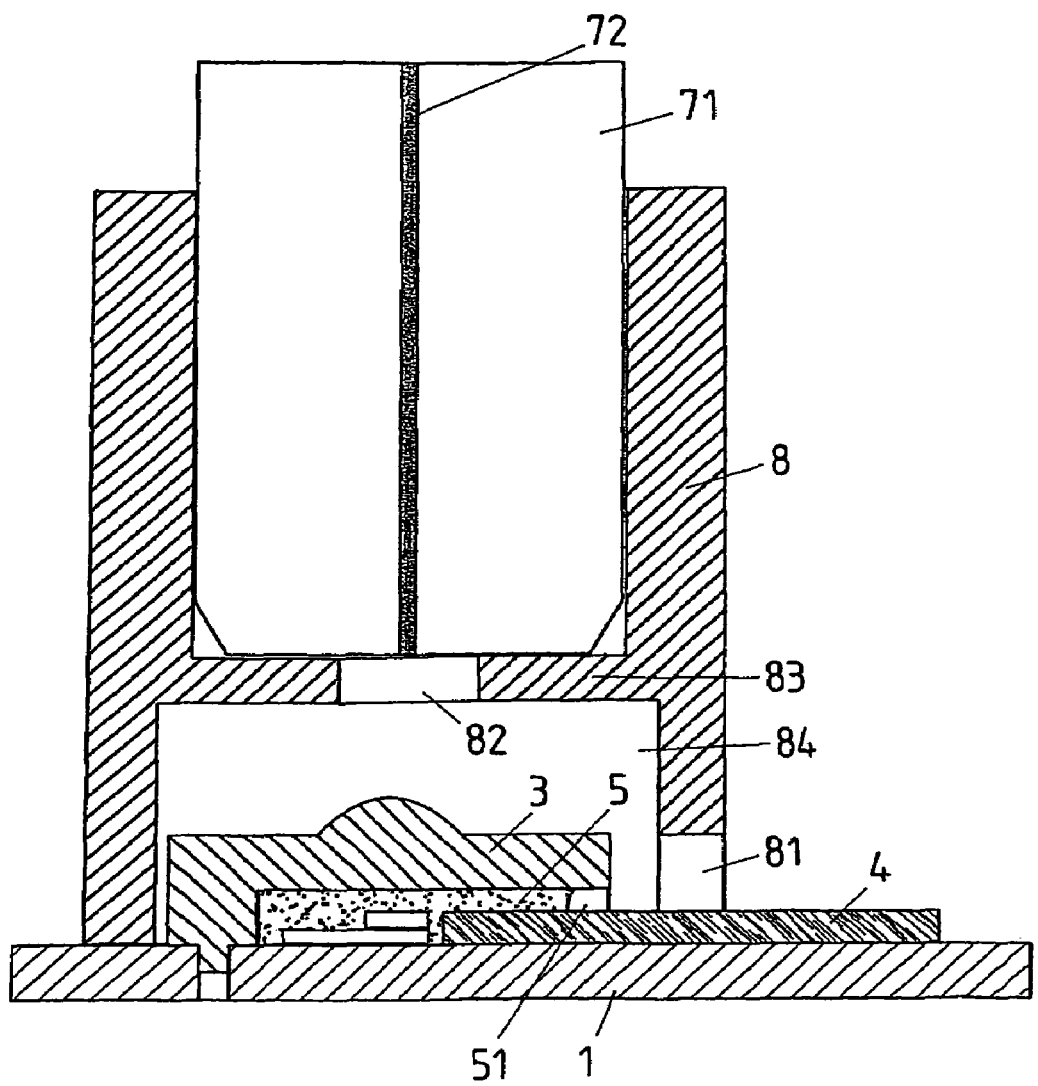
FIG. 3 schematically shows a third exemplary embodiment of a transmitting and/or receiving arrangement, in which an additional coupling element for the coupling on of an optical waveguide is provided.

In the case of the exemplary embodiment of FIG. 3, a separate coupling element 8 is provided, which serves for receiving the guide element 71 with the optical waveguide 72. The coupling element 8 is fastened on the base plate 1, for example by means of prefabricated, corresponding structures on the underside of the coupling element 8 and the mounting area of the base plate 1. If the base plate and the coupling element consist of metal, fastening can also be performed after an adjustment by a material bond, for example laser welding.

The coupling element 8 has a lateral opening 81, which aligns with the lateral opening 51 of the intermediate space 5 between the base plate 1 and the beam-shaping element 3. The carrier element 4 of the electrical line feeds and the casting compound are consequently introduced via the openings 81, 51 in the coupling element 8 and between the base plate 1 and the beam-shaping element 3.

The coupling element 8 has in a way known per se a bearing face 83, provided with a window 82, for an optical waveguide 71, 72 to be coupled on. Under the bearing face 83 it forms a cavity 84, in which the beam-shaping element 3 is located.

Figure 4:
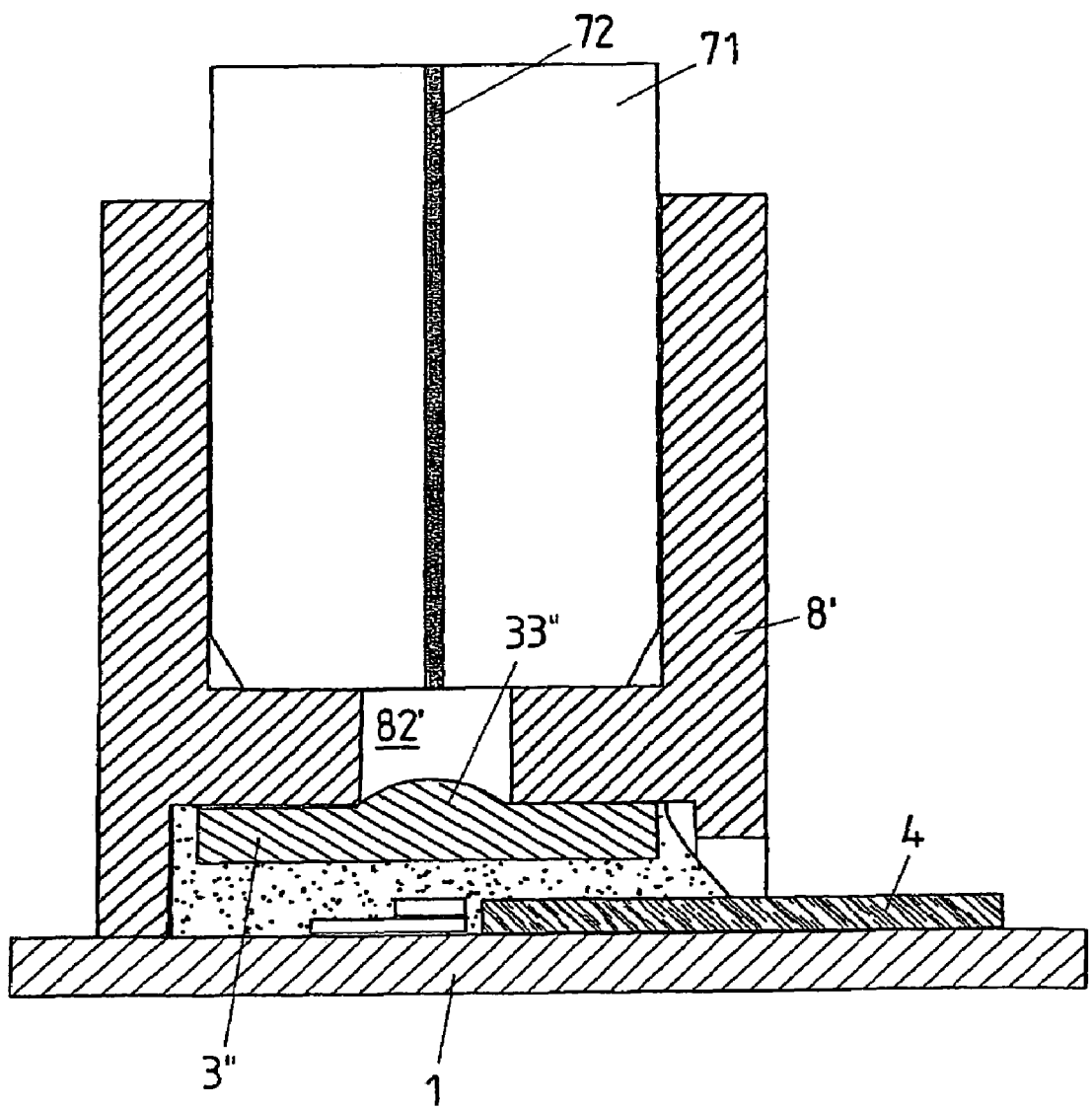
FIG. 4 schematically shows a fourth exemplary embodiment of a transmitting and/or receiving device.

In the exemplary embodiment of FIG. 4, the beam-shaping element 3" is not fastened to the base plate 1 but to the underside of a coupling element 8' in a way corresponding to the coupling element 8 of FIG. 3. For positioning the beam-shaping element 3" with respect to the coupling element 8', the lens 33" of the coupling element 3" protrudes into an opening 82' of the coupling element 8'. At the opposite end of the opening 82' are the end faces of the guide element 71 and the optical fiber 72.

Figure 5:
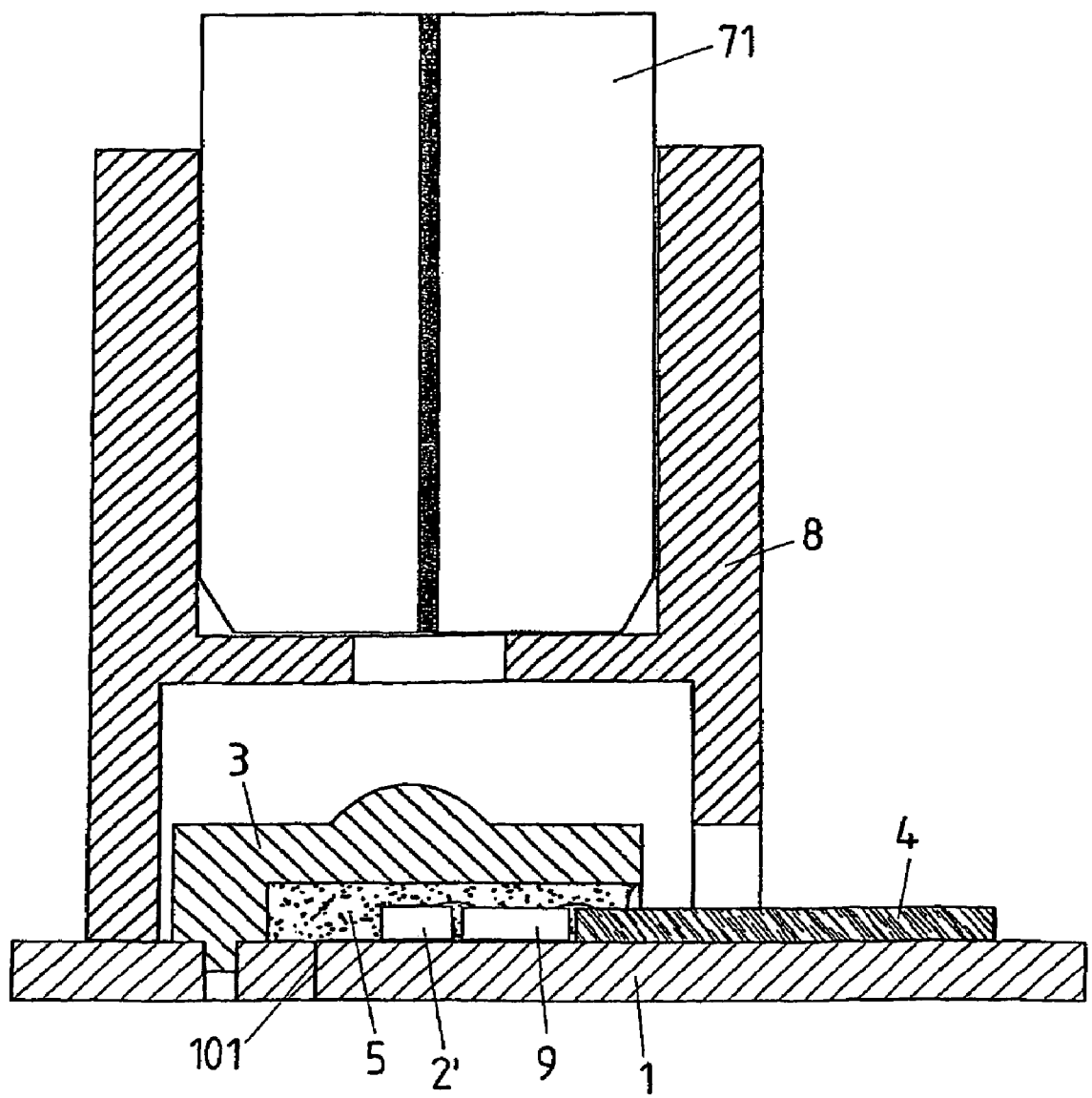
FIG. 5 schematically shows a fifth exemplary embodiment of a transmitting and/or receiving device.

FIG. 5 shows an exemplary embodiment of a transmitting and/or receiving arrangement in which an amplifier chip 9 is mounted on the base plate 1 alongside an optical chip 2' for receiving optical signals (receiver chip). Both the amplifier chip 9 and the receiver chip 2' are contacted by means of the electrical line feeds of the carrier element 4 and schematically represented bonding wires. Both also lie within the intermediate space 5 between the base plate 1 and the beam-shaping element 3.

Also represented in FIG. 5 is an additional drilled hole 101 in the base plate 1, which provides a venting opening and is of significance in particular when filling the intermediate space 5 with casting compound. Otherwise, the construction corresponds to the construction of FIG. 3.

Figure 6:
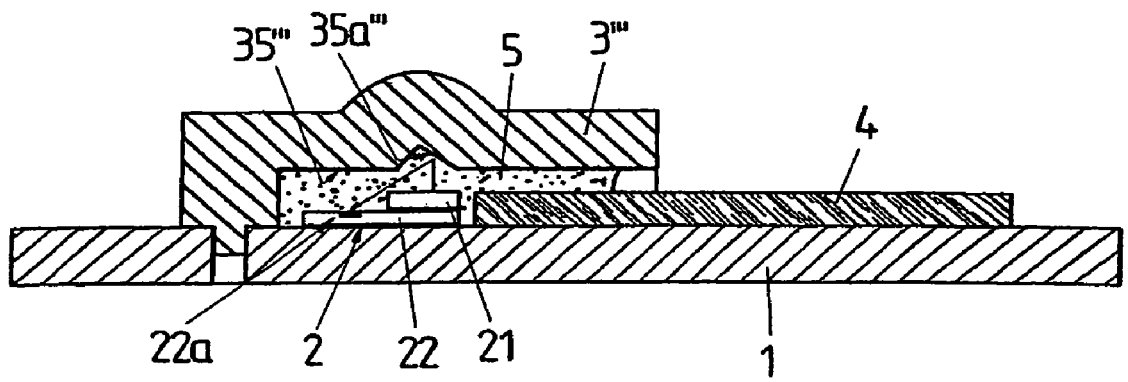
FIG. 6 schematically shows a sixth exemplary embodiment of a transmitting and/or receiving device, in which the beam-shaping element forms a slanting interface.

FIG. 6 shows an alternative exemplary embodiment, which corresponds to the exemplary embodiment of FIG. 1 apart from the feature that the interface 35''' of the beam-shaping element 3''' facing the base plate 1 or the intermediate space 5 does not run parallel to the base plate 1 in a partial region but is formed at an angle and thereby forms a slanting face 35a'''. This has the result that light emitted by the optical chip 2 is partially reflected at the interface between the intermediate space 5 filled with the casting compound and the beam-shaping element 3''' and falls to the side of the transmitting element 21 onto the receiving element 22, the optically active face 22a of which lies alongside the transmitting element 21 in the case of this exemplary embodiment. To increase the proportion of reflected light, it may also be envisaged to provide a partly reflective coating on the slanting face 35a'''.

The receiving element 22 is in this case a monitor diode, which partly detects the light emitted by the transmitting element 21 and feeds it to a monitoring control loop for controlling the optical output of the transmitting element.

When the transmitting element 21 is formed as a VCSEL laser diode, which emits modulated laser light vertically upward, in an alternative variant the monitor diode is located directly under the transmitting diode, a small proportion of light being coupled out downward and onto the monitor diode on the rear face of the laser resonator.

I claim:

1. An arrangement for at least one of transmitting and receiving an optical signal, the arrangement comprising:
   an optical element for one of transmitting and receiving the optical signal;
   a base plate, on which the optical element is arranged;
   electrical line feeds for supplying electrical power to the optical element; and
   a beam-shaping element mounted adjacent to the optical element for at least one of directing light emitted by an optical waveguide coupled to the transmitting and/or receiving arrangement onto the optical element, and coupling light emitted by the optical element into the optical waveguide;
   wherein the base plate, the optical element and the beam-shaping element are arranged such that an intermediate space is provided between the base plate and the beam-shaping element in which the optical element is located;
   wherein the electrical line feeds are arranged on a carrier element that is fastened to the base plate and extends at least partly into the intermediate space, the carrier element with the electrical line feeds having an edge that is located adjacent to the partly filling a lateral opening portion of the intermediate space, and
   wherein, in addition to a first opening of the intermediate space through which the electrical feed lines extend, one of the base plate and the beam-shaping element defines at least one further opening that communicates with the intermediate space.

2. The arrangement as claimed in claim 1, wherein the intermediate space is at least partly filled by a transparent casting material such that the transparent casting material extends along an optical beam path between the optical element and the beam shaping element.

3. The arrangement as claimed in claim 1, wherein the base plate comprises mechanical structures for at least one of mechanical and optical alignment of the optical element.

4. The arrangement as claimed in claim 3, wherein the optical element is aligned relative to the mechanical structures of the base plate.

5. The arrangement as claimed in claim 3, wherein the beam-shaping element has on a side facing the base plate mechanical structures which correspond to the mechanical structures of the base plate and are fastened on the base plate by these mechanical structures.

6. The arrangement as claimed in claim 5, wherein the beam-shaping element has on the side facing the base plate a recess that forms the intermediate space between the base plate and the beam-shaping element.

7. The arrangement as claimed in claim 1, wherein the carrier element comprises a ceramic substrate, and wherein the line feeds are formed on an upper surface of the ceramic substrate.

8. The arrangement as claimed in claim 1, wherein the beam-shaping element defines, on a side facing away from the base plate, contours for receiving an optical waveguide.

9. The arrangement as claimed in claim 1, further comprising a coupling element for receiving an optical waveguide that is connected to the base plate, wherein the coupling element defines at least one lateral opening for receiving the electrical feed lines.

10. The arrangement as claimed in claim 9, wherein the coupling element has on a side facing the base plate a recess, in which the beam-shaping element is arranged.

11. The arrangement as claimed in claim 10, wherein the beam-shaping element is fastened to the coupling element connected to the base plate.

12. The arrangement as claimed in claim 1, further comprising at least one of an electronic component and an optoelectronic component arranged in the intermediate space between the base plate and the beam-shaping element.

13. The arrangement as claimed in claim 12, wherein the optical element comprises a transmitting element, and wherein the arrangement further comprises a monitor diode arranged under the transmitting element.

14. The arrangement as claimed in claim 12, wherein the optical element comprises a transmitting element, and wherein the arrangement further comprises a monitor diode arranged within the intermediate space and alongside the transmitting element.

15. The arrangement as claimed in claim 14, wherein the beam-shaping element forms at the interface with the intermediate space a slanting region aligned such that part of the radiation emitted by the transmitting element is reflected back onto the monitor diode.

16. The arrangement as claimed in claim 15, further comprising a partly reflective film applied to the slanting region.

17. The arrangement as claimed in claim 1, wherein the base plate comprises at least a part of a leadframe.

* * * * *